US008440533B2

(12) United States Patent
Toh et al.

(10) Patent No.: US 8,440,533 B2
(45) Date of Patent: May 14, 2013

(54) SELF-ALIGNED CONTACT FOR REPLACEMENT METAL GATE AND SILICIDE LAST PROCESSES

(75) Inventors: Eng Huat Toh, Singapore (SG); Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 138 days.

(21) Appl. No.: 13/041,134

(22) Filed: Mar. 4, 2011

(65) Prior Publication Data
US 2012/0223394 A1 Sep. 6, 2012

(51) Int. Cl.
*H01L 21/336* (2006.01)

(52) U.S. Cl.
USPC ........... 438/299; 438/221; 438/296; 438/424; 438/595; 438/740

(58) Field of Classification Search .................. 438/221, 438/296, 299, 424, 581, 586, 595, 618, 631, 438/637, 740
See application file for complete search history.

(56) References Cited

U.S. PATENT DOCUMENTS

| 5,843,820 | A | * | 12/1998 | Lu .................................. 438/243 |
| 6,316,803 | B1 | * | 11/2001 | Ban et al. ....................... 257/311 |
| 6,406,987 | B1 | * | 6/2002 | Huang ........................... 438/595 |
| 2002/0000629 | A1 | | 1/2002 | Kim et al. |
| 2007/0141798 | A1 | | 6/2007 | Bohr |

* cited by examiner

*Primary Examiner* — Ori Nadav
(74) *Attorney, Agent, or Firm* — Ditthavong Mori & Steiner, P.C.

(57) ABSTRACT

A high-K/metal gate semiconductor device is provided with larger self-aligned contacts having reduced resistance. Embodiments include forming a first high-k metal gate stack on a substrate between source/drain regions, a second high-k metal gate stack on an STI region, and a first ILD between the metal gate stacks, forming an etch stop layer and a second ILD sequentially over the substrate, with openings in the second ILD over the metal gate stacks, forming spacers on the edges of the openings, forming a third ILD over the second ILD and the spacers, removing the first ILD over the source/drain regions, removing the etch stop layer, the second ILD, and the third ILD over the source/drain regions, adjacent the spacers, and over a portion of the spacers, forming first trenches, removing the third ILD over the second high-k metal gate stack and over a portion of the spacers, forming second trenches, and forming contacts in the first and second trenches.

9 Claims, 10 Drawing Sheets

SELF-ALIGNED CONTACT FOR REPLACEMENT METAL GATE AND SILICIDE LAST PROCESSES

TECHNICAL FIELD

The present disclosure relates to the fabrication of semiconductor devices using a replacement metal gate process and self-aligned contacts. The present disclosure is particularly applicable to semiconductor devices in 32 nanometer (nm) technology nodes and beyond.

BACKGROUND

In advanced sub-32 nanometer (nm) technologies, a replacement gate (RMG) is employed with a pre/post metal anneal (PMA). The high-k stack thermal budget, coupled with the PMA high temperature, may impact the thermal stability of the silicides. As such, a silicide last process may be required. However, the high-k metal gate must then be well-protected against the stripping of un-reacted wet nickel (Ni).

Figure 1A:
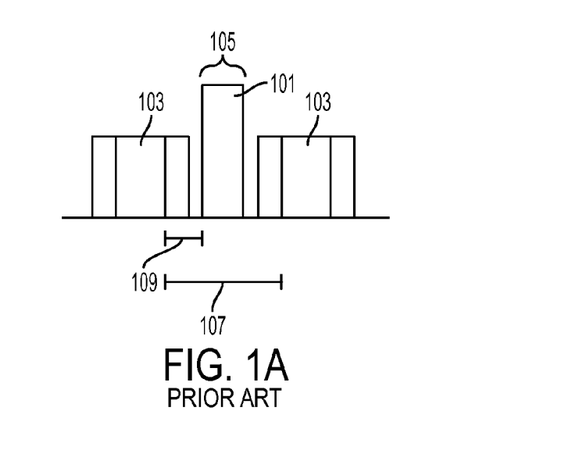
FIG. 1A schematically illustrates a contact formed by direct patterning.
Figure 1B:
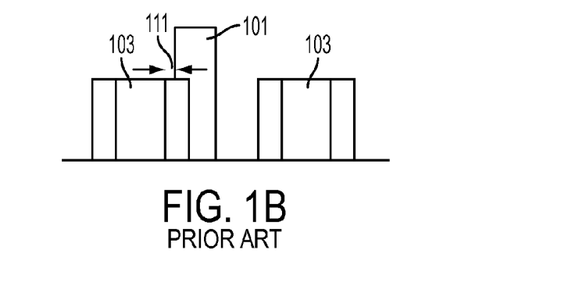
FIG. 1B schematically illustrates misalignment and dielectric breakdown in forming the contact of FIG. 1A.
Figure 1C:
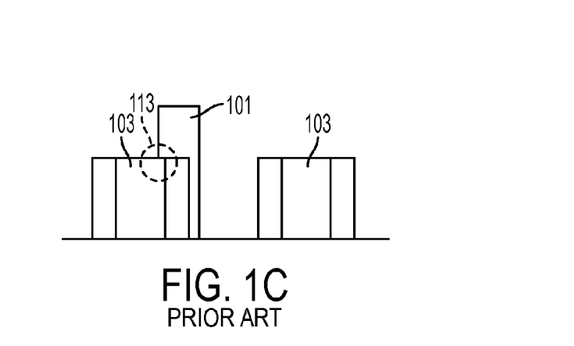
FIG. 1C schematically illustrates misalignment and a gate-to-contact short in forming the contact of FIG. 1A.

Another issue is the tight gate-to-gate spacing and the design rule (DR) requirement to place a contact there between. Adverting to FIG. 1A, the gate-to-gate pitch is getting so narrow that placing a contact 101 between two gates 103 using direct patterning is challenging. The contact size must be small. As shown, contact critical dimension (CD) 105 equals gate-to-gate space 107 minus 2 times the gate-to-contact distance 109. If the gate-to-contact distance 109 does not take into account the minimum gate-to-contact distance, to prevent gate-to-contact dielectric breakdown (illustrated at 111 in FIG. 1B) and gate-to-contact shorts (illustrated at 113 in FIG. 1C), plus an overlay margin, then any misalignment during contact lithography would cause dielectric breakdown due to a high electric field or a direct gate-to-contact short. Accordingly, contact size is restricted for direct patterning.

Figure 2A:
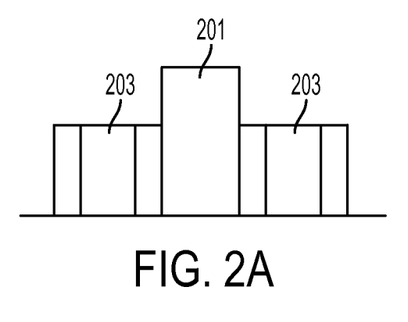
FIG. 2A schematically illustrates a contact formed by SAC.
Figure 2B:
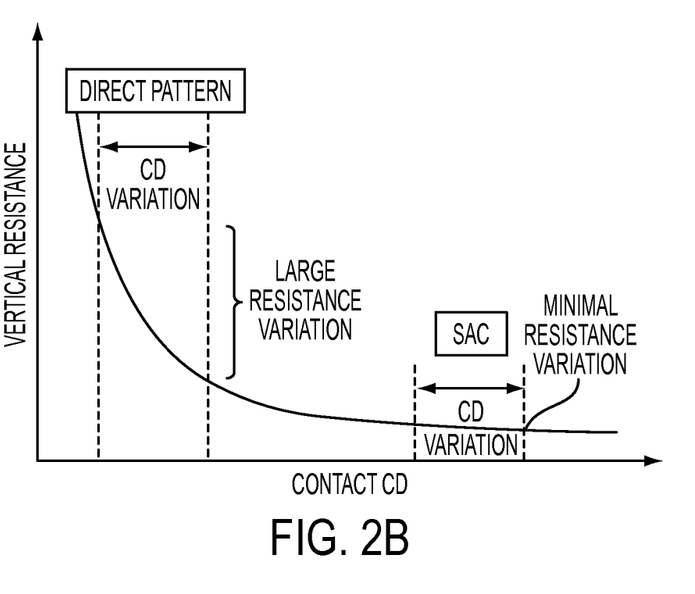
FIG. 2B plots contact resistance versus contact CD for direct patterning and SAC.

Due to the small contact size for the direct patterned method, not only is the contact resistance high, but also variation in resistance is large because of CD variation. A self-aligned contact (SAC) method for RMG processes (illustrated in FIG. 2A with contact 201 between two gates 203) achieves lower resistance and minimal variation, as shown in FIG. 2B.

Figure 3:
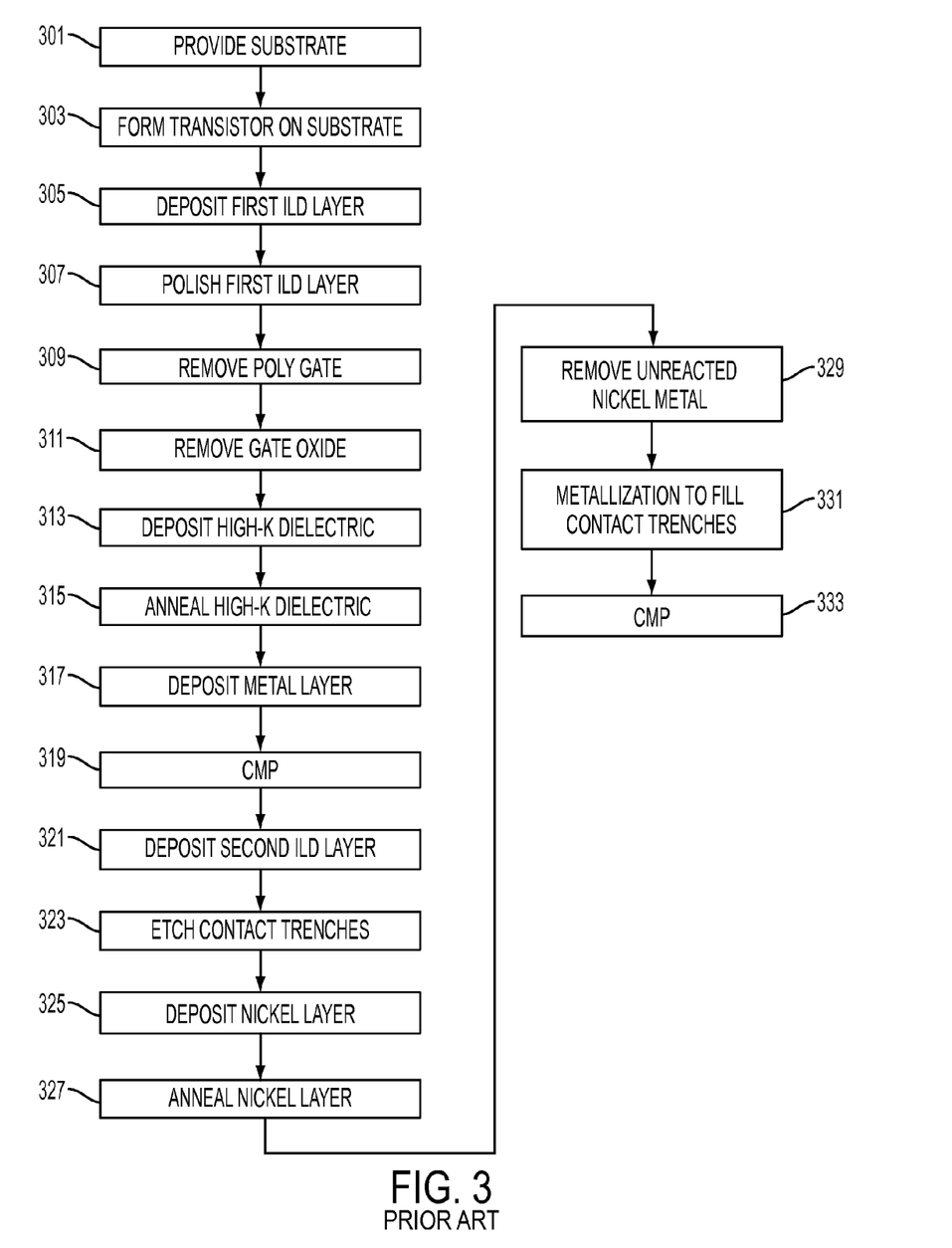
FIG. 3 illustrates a conventional silicide last process flow.
Figure 4A:
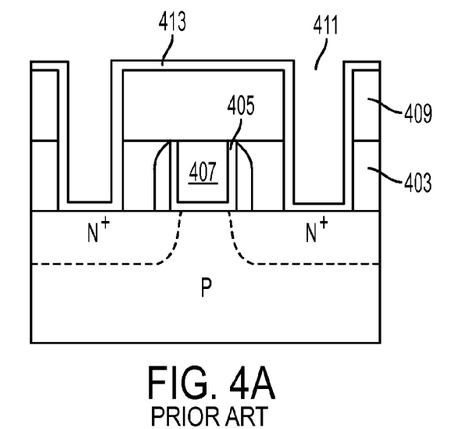
FIGS. 4A through 4C schematically illustrate portions of a conventional silicide last process flow.

A known silicide last process flow is illustrated in FIG. 3 and schematically illustrated in FIGS. 4A through 4C. Adverting to FIGS. 3 and 4A, a substrate 401 is provided (step 301), a transistor with a dummy gate is formed on the substrate (step 303), a first ILD 403 is deposited (step 305) and polished (step 307). The polysilicon gate is then removed (step 309) followed by removal of the gate oxide (step 311). A high-k metal gate is then formed by depositing a high-k dielectric 405 (step 313), annealing the dielectric (step 315), depositing a metal layer 407 (step 317), and performing chemical mechanical polishing (CMP) (step 319). In step 321, a second ILD layer 409 is deposited in which contact trenches 411 are etched (step 323) and a nickel (Ni) layer is deposited (step 325).

Figure 4B:
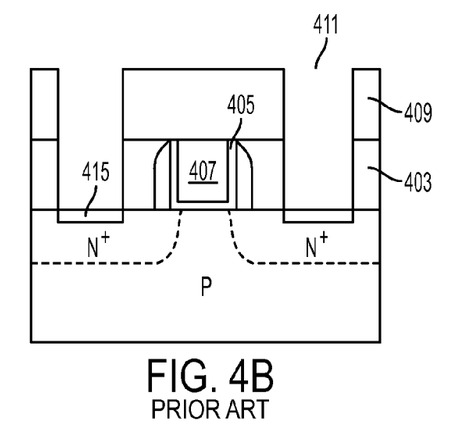
Figure 4C:
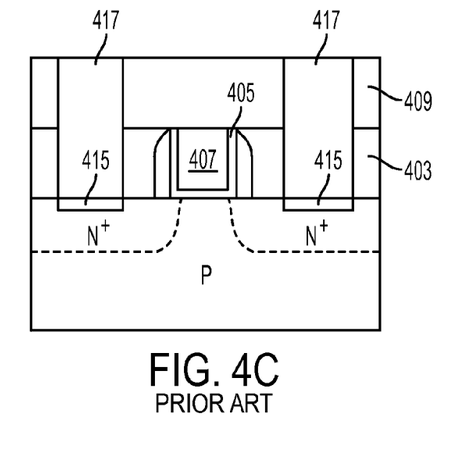

As illustrated in FIG. 4B, the Ni is annealed (step 327), forming silicide 415, and the unreacted metal is removed (step 329). The contact trenches are then filled with metal 417 (step 331), and the surface is polished by CMP (step 333), as shown in FIG. 4C. Since the contacts that are formed by this process are not self-aligned, damage to the high-k metal gate due to contact etch will occur if there is misalignment. Moreover, the small contact size may adversely affect the amount of Ni that is deposited on the source/drain. As such, silicides may not form adequately.

A conventional method of forming an SAC employs a gate oxidation scheme to form a protective layer on top of a tungsten (W) gate. If silicides are formed early in the process (i.e., silicide first), the gate stack and silicides are subjected to another possibly high thermal budget, which may affect stability. There is potential $V_t$ impact on the gate during gate oxidation due to oxygen ingress into the high-k dielectric. If a gate oxide exists on the gate pad, then contact on the gate pad cannot be achieved simultaneous with source/drain contact. If no gate oxide exists, then contact etching will damage the gate pad. The recessed metal gate suggests that the dummy polysilicon gate height needs to be significantly larger than conventional to meet final metal gate resistance requirements. This implies more shadowing and limitation on halo tilt for SCE control. Due to the structure, weak points exist at high-k dielectric edges that could cause potential gate-to-contact shorts. Further, the weak points also reduce immunity to un-reacted Ni wet strip, if a silicide last process is employed. Overall, there is a high process risk.

A need therefore exists for methodology enabling a silicide last approach with formation of SAC, with improved overlay tolerance and increased contact size, and the resulting devices.

SUMMARY

An aspect of the present disclosure is a method of fabricating a high-K/metal gate semiconductor device with self-aligned contacts by forming additional spacers on the high-k metal gates.

Another aspect of the present disclosure is a high-K/metal gate semiconductor device with larger self-aligned contacts with reduced resistance.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: forming a first high-k metal gate stack on a substrate between source/drain regions, a second high-k metal gate stack on a shallow trench isolation (STI) region, and a first inter layer dielectric (ILD) between the first and second metal gate stacks; forming an etch stop layer on the first and second metal gate stacks; forming a second ILD on the etch stop layer, with openings over the first and second gate stacks; forming first and second spacers on the edges of the openings; forming a third ILD over the second ILD and the first and second spacers; removing the first ILD over the source/drain regions and the etch stop layer, the second ILD, and the third ILD over the source/drain regions, adjacent the first spacers, and over a portion of the first spacers, forming first trenches; removing the third ILD over the second high-k metal gate stack and over a portion of the second spacers, forming second trenches; and forming contacts in the first and second trenches.

Aspects of the present disclosure include forming the first and second high-k metal gate stacks by: forming a first dummy gate, having first dummy spacers thereon, on the substrate, and forming a second dummy gate, having second dummy spacers thereon, on the STI region in the substrate; forming the first ILD over the first and second dummy gates; chemical mechanical polishing (CMP) the first ILD down to the top of the first and second dummy gates; removing the first and second dummy gates, forming first and second cavities;

depositing a high-k dielectric layer and a metal work function layer in the first and second cavities, and filling the remainder of the first and second cavities with metal. Further aspects include CMP until the first and second dummy spacers are planar with the top surface of the first and second dummy gates. Other aspects include forming the etch stop layer of aluminum oxide ($Al_2O_3$) or hafnium oxide ($HfO_2$). Another aspect includes forming the openings in the second ILD using a reverse gate mask. Additional aspects include forming the first and second spacers by depositing a nitride material in the openings and etching the nitride. Further aspects include CMP subsequent to forming the third ILD. Other aspects include forming a silicide on the source/drain regions prior to forming the first ILD. Additional aspects include forming a silicide on the source/drain regions subsequent to forming the first and second trenches; and subsequently forming contacts in the trenches.

Another aspect of the present disclosure is a device including a substrate; an STI region in a portion of the substrate; a first high-k metal gate stack having first spacers thereon, on the substrate between source/drain regions; a second high-k metal gate stack having second spacers thereon on the STI region; an etch stop layer on the first and second high-k metal gate stacks, the etch stop layer having an opening over a portion of the second high-k metal gate stack; a pair of third spacers on the etch stop layer over the first high-k metal gate stack; a pair of fourth spacers on the etch stop layer on the second high-k metal gate stack; an ILD between the third spacers; a first contact on each side of the first high-k metal gate and over a portion of the first spacers; and a second contact between and over a portion of the fourth spacers.

Aspects include a device including a silicide on the source/drain regions. Further aspects include a device including an etch stop layer of $Al_2O_3$ or $HfO_2$. Another aspect includes a device having third and fourth spacers of nitride. Additional aspects include a device wherein a top of the first and second spacers is planar with the top surface of the first and second high-k metal gate stacks. Other aspects include a device wherein the third and fourth spacers each have a sidewall away from the first and second high-k metal gate respectively, the sidewall being closer laterally to the metal gate at the top than at the bottom.

Another aspect of the present disclosure is a method including: forming a first high-k metal gate stack on a substrate between source/drain regions, a second high-k metal gate stack on a shallow trench isolation (STI) region, and a first inter layer dielectric (ILD) between the first and second metal gate stacks; forming an etch stop layer on the first and second metal gate stacks; forming a second ILD on the etch stop layer, with openings over the first and second gate stacks, the openings having a larger critical dimension at the bottom of the openings than at the top of the openings; forming first and second spacers on the edges of the openings; forming a third ILD over the second ILD and the first and second spacers; removing the first ILD over the source/drain regions and the etch stop layer, the second ILD, and the third ILD over the source/drain regions, adjacent the first spacers, and over a portion of the first spacers, forming first trenches; removing the third ILD over the second high-k metal gate stack and over a portion of the second spacers, forming second trenches; and forming contacts in the first and second trenches.

Aspects include forming the openings in the second ILD to have angled sidewalls with a slope of 50° to 90°. Further aspects include forming the etch stop layer of aluminum oxide ($Al_2O_3$) or hafnium oxide ($HfO_2$). Another aspect include comprising forming the first and second spacers by depositing a nitride material in the openings and etching the nitride. Additional aspects include forming a silicide on the source/drain regions subsequent to forming the first and second trenches; and subsequently forming contacts in the trenches.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of silicide damage due to high temperatures attendant upon replacement metal gate processes, when used with a silicide first approach, and the problem of attacks on the high-k metal attendant upon wet stripping un-reacted Ni when a silicide last approach is employed. Concurrently, the present disclosure addresses problems of high contact resistance and resistance variation due to small contact size attendant upon direct patterning processes for the contacts. In accordance with embodiments of the present disclosure, an SAC process is employed, with an etch stop layer and an additional set of spacers on the gate stack. The etch stop layer and extra spacers provide a protecting layer for the gate stack, protecting the gate stack from attack during wet strip of the unreacted Ni in a silicide last approach. The extra spacers further provide additional margin for the contacts, thereby allowing for larger contacts, which in turn lowers contact resistance.

Methodology in accordance with embodiments of the present disclosure includes forming a first high-k metal gate stack on a substrate between source/drain regions, a second high-k metal gate stack on a shallow trench isolation (STI) region, and a first inter layer dielectric (ILD) between the first and second metal gate stacks, forming an etch stop layer on the first and second metal gate stacks, forming a second ILD on the etch stop layer, with openings over the first and second gate stacks, forming first and second spacers on the edges of the openings, forming a third ILD over the second ILD and the first and second spacers, removing the first ILD over the source/drain regions and the etch stop layer, the second ILD, and the third ILD over the source/drain regions, adjacent the first spacers, and over a portion of the first spacers, forming first trenches, removing the third ILD over the second high-k metal gate stack and over a portion of the second spacers, forming second trenches, and forming contacts in the first and second trenches.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 7:
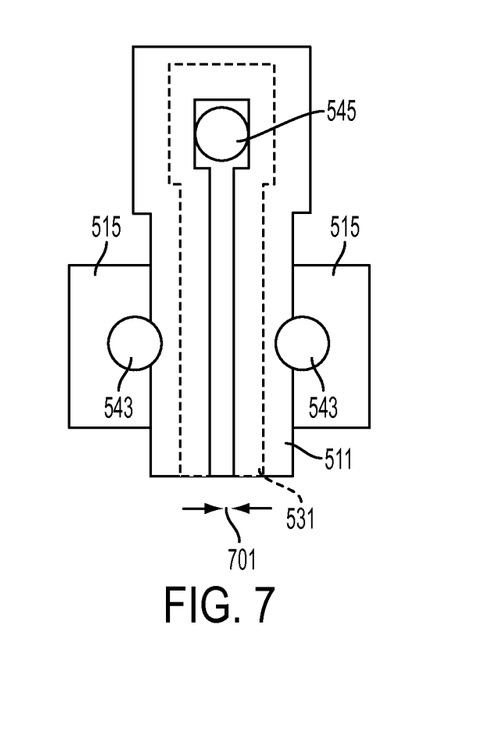
FIG. 7 illustrates top view of a large gate length transistor from the device of FIG. 5I.

FIGS. 5A through 5I schematically illustrate a process flow for contact formation with a replacement metal gate approach, in accordance with an exemplary embodiment. FIG. 7 schematically illustrates a top view of a large gate length transistor from the resulting device, in which the gate length corresponds to element 701. Adverting to FIG. 5A, conventional front-end-of-line (FEOL) processing is performed through CMP of dummy gates. Specifically, an STI region 501 is formed in a silicon substrate 503. A large gate length dummy gate 505 and a small gate length dummy gate 507 are formed on substrate 503, and a gate pad dummy gate 509 is formed on STI 501. Dummy gates may, for example, be formed of polysilicon or amorphous silicon (a-Si). Spacers 511 are formed adjacent dummy gates 505 and 507 and spacers 513 are formed adjacent dummy gate 509. Source/drain regions 515 are formed in substrate 503 on both sides of dummy gate 505 and dummy gate 507. An ILD 517, for example an oxide layer, is formed over the entire device, and CMP is performed to expose the top surface of dummy gates 505, 507, and 509. CMP may optionally continue until the tops of spacers 511 and 513 are substantially level with dummy gates 505, 507, and 509.

Figure 5A:
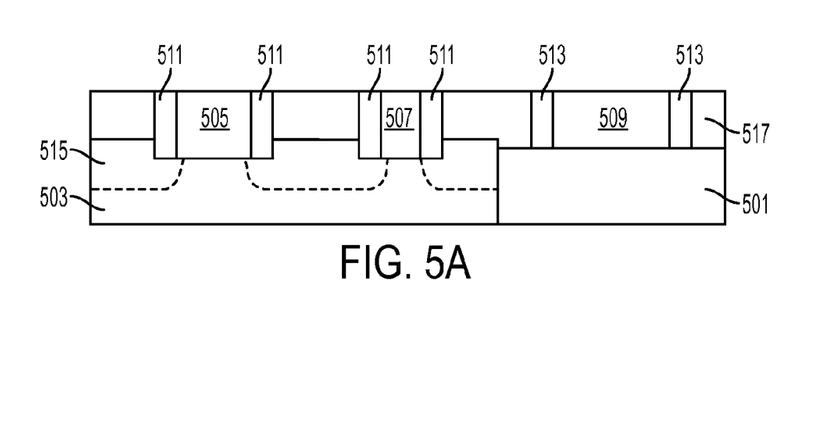
FIGS. 5A through 5I schematically illustrate a process flow for contact formation, in accordance with an exemplary embodiment.
Figure 5B:
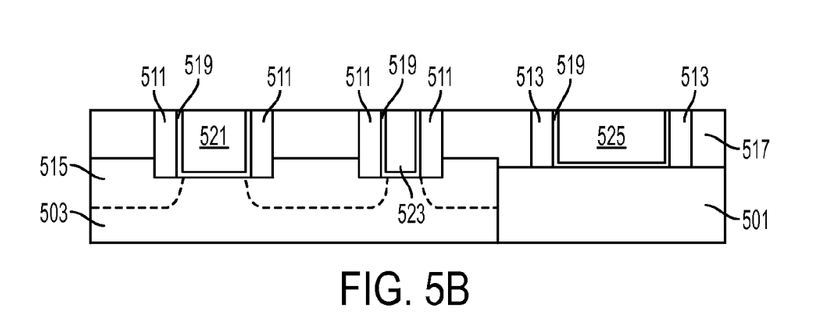

As illustrated in FIG. 5B, the dummy gates are removed, leaving a cavity between each pair of spacers 511 and 513. A high-k dielectric layer 519, for example hafnium silicon oxynitride (HfSiON) and a work function tuning layer (not shown for illustrative convenience), such as titanium nitride (TiN) or tantalum nitride (TaN), are deposited in each cavity. Metal, for example aluminum, is filled in each cavity to form metal gates 521, 523, and 525. CMP is then performed. If CMP in FEOL processing does not result in the tops of spacers 511 and 513 being substantially level with dummy gates 505, 507, and 509, then CMP in FIG. 5B continues until the spacers are substantially level with metal gates 521, 523, and 525.

Figure 5C:
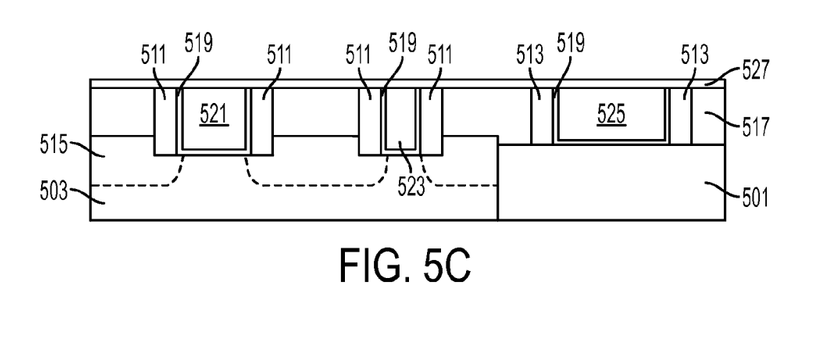

An etch stop layer 527 is then deposited over the entire device, as illustrated in FIG. 5C. Etch stop layer 527 may, for example be formed of aluminum oxide ($Al_2O_3$) or hafnium oxide ($HfO_2$), and may be formed to a thickness of 50 Å to 500 Å.

Figure 5D:
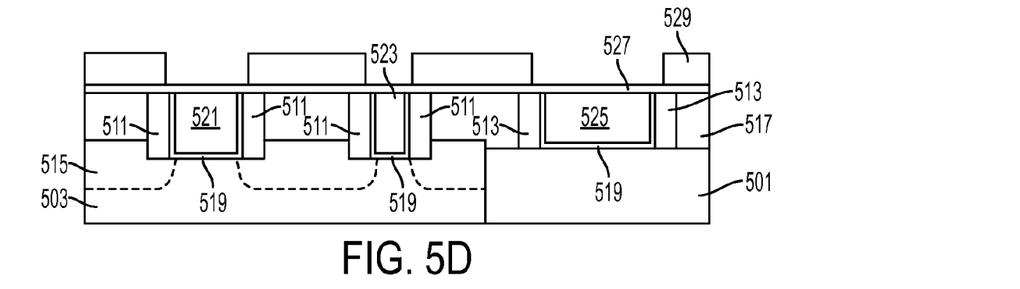

Adverting to FIG. 5D, a second ILD 529 is deposited over the entire device, to a thickness of 100 Å to 1000 Å, and etched, for example by a reverse gate mask etching, to open gate regions. A reverse gate mask is generated from the gate mask layer. For a source/drain region where there is a contact, the CD of the photoresist on top the source/drain would be larger than the minimum design rule, but for a source/drain region where there is no contact, and the gate-to-gate spacing is very close, the photoresist CD could be smaller than the minimum design rule. To avoid this, the photoresist pattern is removed from the non-contacted source/drain by using an alternative mask generation rule, thereby removing the patterning on non-contacted source/drains.

Figure 5E:
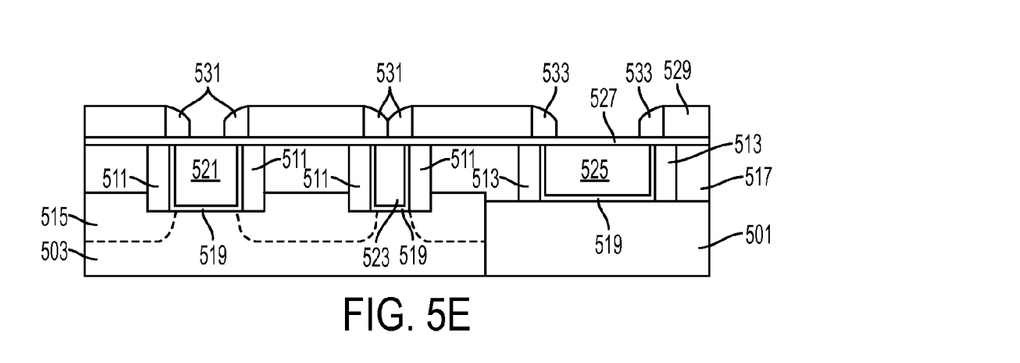

After ILD 529 is etched, top spacers 531 may be formed on the edges of second ILD 529 over metal gates 521 and 523, and top spacers 533 may be formed on the edges of second ILD 529 over metal gate 525, as illustrated in FIG. 5E. Top spacers 531 and 533 may, for example, be formed by depositing a nitride material in the open areas of ILD 529 and etching the nitride to a width of 100 Å to 1000 Å. A second etch stop layer, for example of $Al_2O_3$ or $HfO_2$, may optionally be deposited prior to forming top spacers 531 and 533.

Figure 5F:
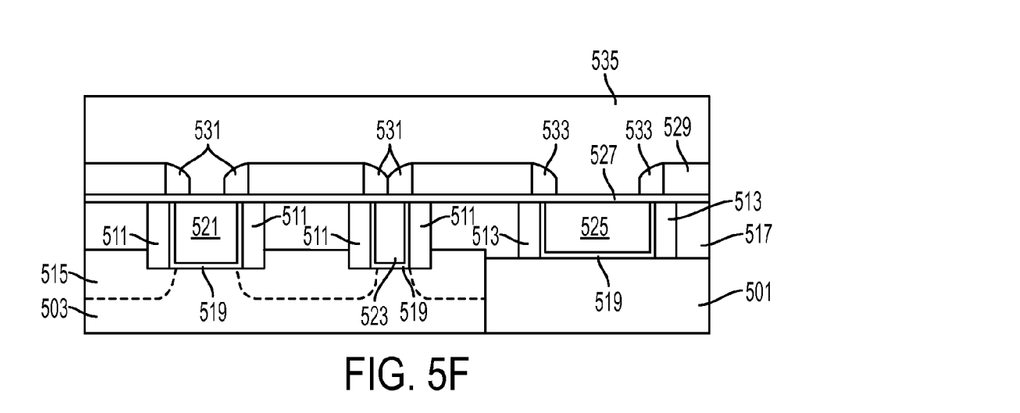
Figure 5G:
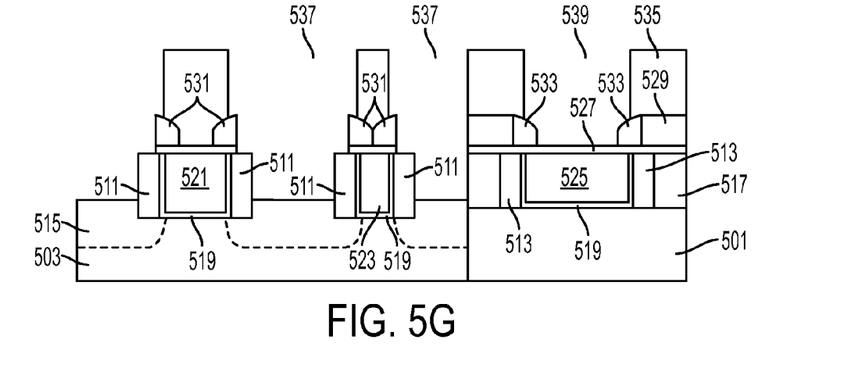

As illustrated in FIG. 5F, a third ILD 535 is deposited over the entire device, followed by CMP. Trenches 537 and 539 may then be formed, as illustrated in FIG. 5G, for example by lithography and etching, for forming contact regions. A larger contact CD may be patterned by etching down to spacers 531 and 533, rather than aligning the contacts with spacers 511 and 513. Further top spacers 531 and 533 allow for a larger tolerance for misalignment. An additional thin spacer (not shown for illustrative convenience) may be added for greater gate-to-contact tolerance.

Figure 5H:
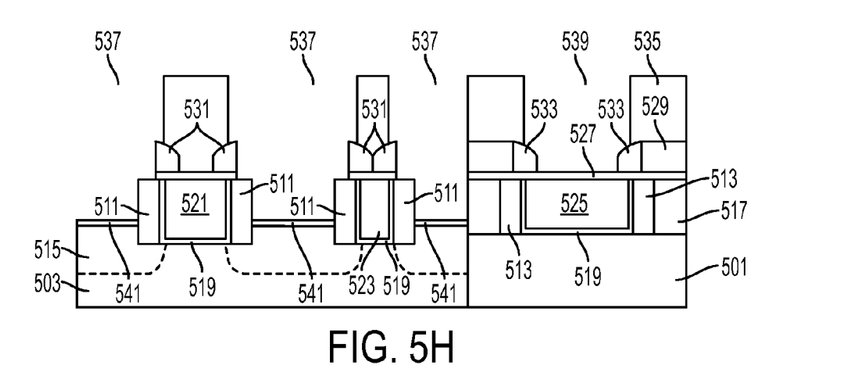

Adverting to FIG. 5H, a silicide 541 may be formed on source/drain regions 515. Silicide 541 may be formed by depositing Ni in trenches 537 and performing a thermal anneal. Un-reacted Ni may then be removed by wet stripping. Alternatively, silicide 541 may be formed prior to the deposition of ILD 517, and the step of forming a silicide in FIG. 5H may be omitted.

Figure 5I:
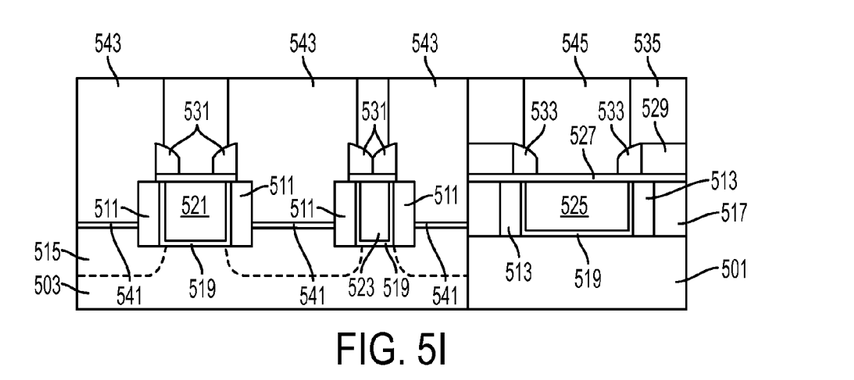

As illustrated in FIG. 5I, etch stop layer 527 is then removed from gate pad 525. Trenches 537 and 539 may then be filled with a conductive material, such as tungsten, copper (after depositing a barrier layer), or TiN/W, to form contacts 543 and 545. Conventional back-end-of-line (BEOL) processing may then proceed.

FIGS. 6A through 6F schematically illustrate a process flow for contact formation, in accordance with another exemplary embodiment. The initial process flow of this embodiment is similar to that illustrated in FIGS. 5A through 5C. Adverting to FIG. 6A, after formation of etch stop layer 527, a second ILD 601 is deposited and etched to form open up the region over gates 521, 523, and 525 by forming trenches. The trenches are formed by dry etch using a power/voltage bias to create angled sidewalls with a slope of 50° to 90°. The larger bottom CD improves misalignment and ensures the metal gates are protected during later processes.

Figure 6A:
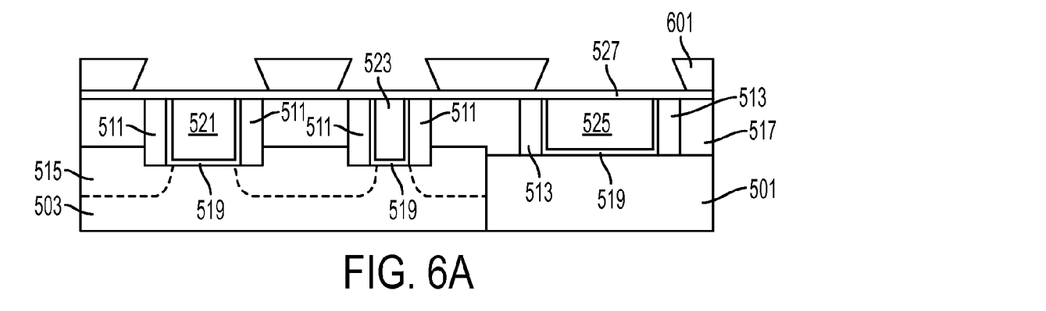
FIGS. 6A through 6F schematically illustrate a process flow for contact formation, in accordance with another exemplary embodiment.
Figure 6B:
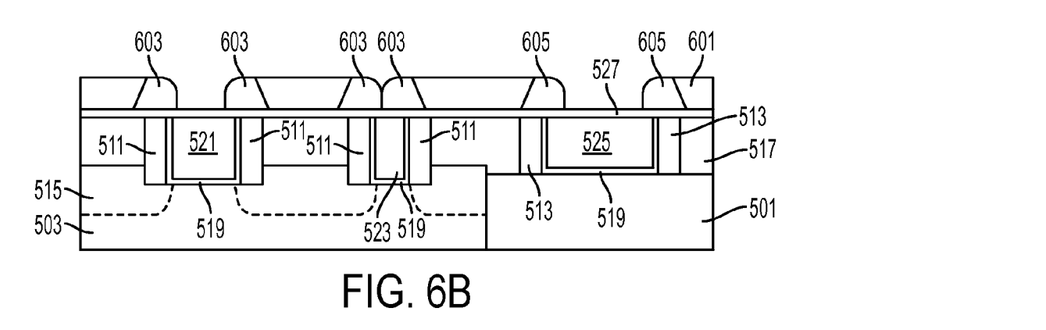
Figure 6C:
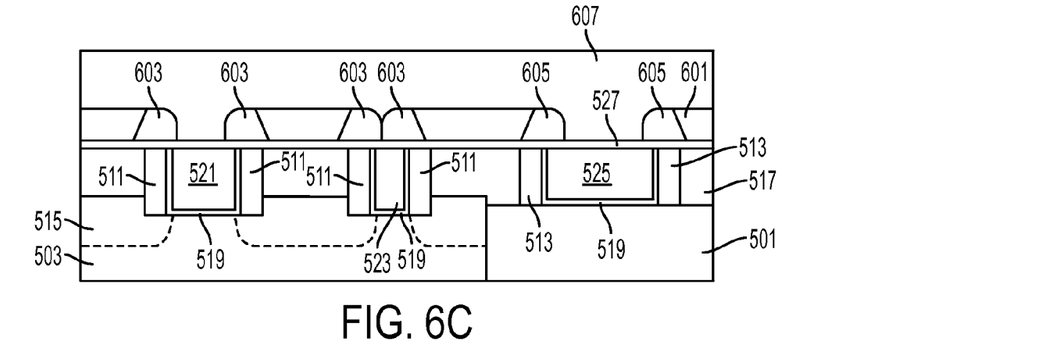
Figure 6D:
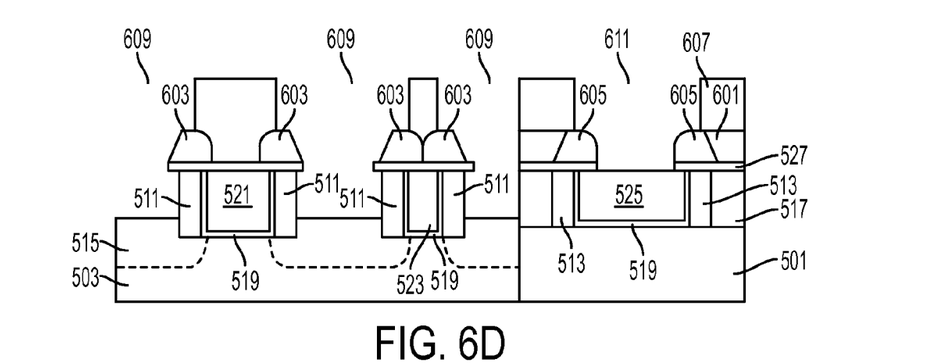

As illustrated in FIG. 6B, top spacers 603 may then be formed on the edges of second ILD 601 over metal gates 521 and 523, and top spacers 605 may be formed on the edges of second ILD 601 over metal gate 525. Top spacers 603 and 605 may, for example, be formed by depositing a nitride material in the open areas of ILD 529 and etching the nitride to a width of 100 Å to 1000 Å. A second etch stop layer, for example of $Al_2O_3$ or $HfO_2$, may optionally be deposited prior to forming top spacers 603 and 605. As illustrated in FIG. 6C, a third ILD 607 is deposited over the entire device, followed by CMP. Trenches 609 and 611 may then be formed, as illustrated in FIG. 6D, for example by lithography and etching, for forming contacts areas. A larger contact CD may be patterned by etching down to spacers 603 and 605, rather than aligning the contacts with spacers 511 and 513. Further top spacers 603 and 605 allow for a larger tolerance for misalignment. An additional thin spacer (not shown for illustrative convenience) may be added for greater gate-to-contact tolerance.

Figure 6E:
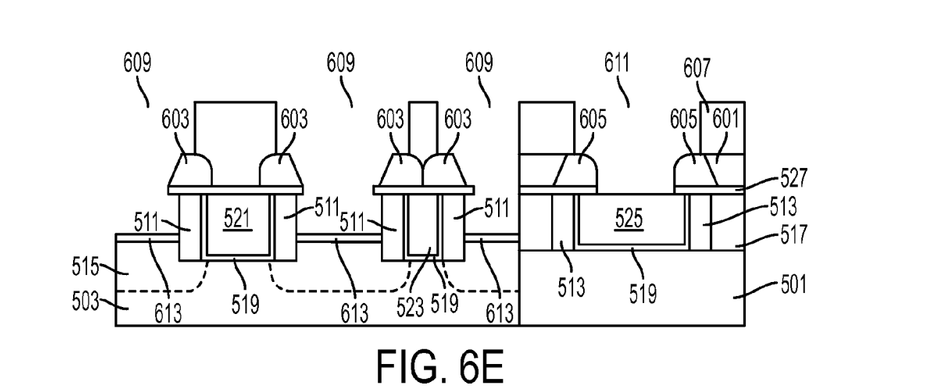

Adverting to FIG. 6E, a silicide 613 may be formed on source/drain regions 515. Silicide 613 may be formed by depositing Ni in trenches 609 and performing a thermal anneal. Un-reacted Ni may then be removed by wet stripping. Alternatively, silicide 613 may be formed prior to the deposition of ILD 517, and the step of forming a silicide in FIG. 6D may be omitted.

Figure 6F:
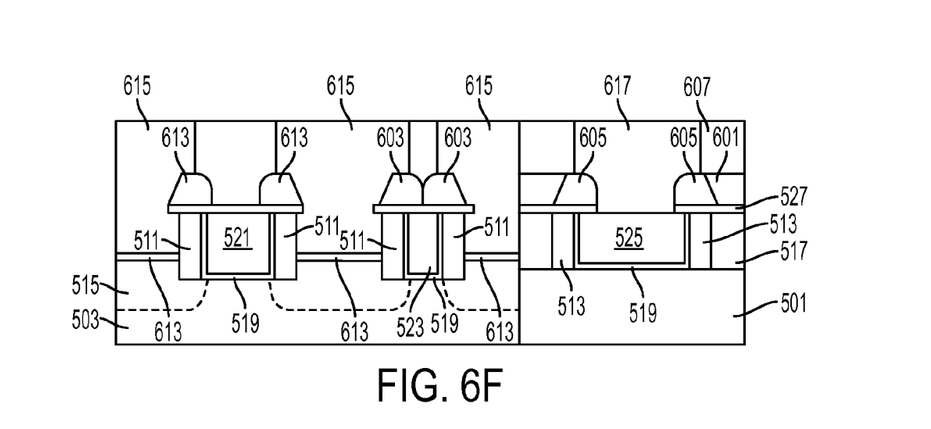

As illustrated in FIG. 6F, etch stop layer 527 is then removed from gate pad 525. Trenches 609 and 611 may then be filled with a conductive material, such as tungsten, copper (after depositing a barrier layer), or TiN/W, to form contacts 615 and 617. Conventional back-end-of-line (BEOL) processing may then proceed.

The embodiments of the present disclosure can achieve several technical effects, including reduced contact resistance and resistance variation, easier trench fill due to larger contact CD, greater tolerance for overlay misalignment due to protective top spacers, improved dielectric breakdown immunity and/or minimized gate-to-contact shorts due to greater gate-to-contact distance, and improved silicide. In addition, no additional gate oxidation process is necessary that would impact the stability of the high-k metal gate or silicide or degrade Vt, no gate height increase is needed, which in turn eliminates shadowing effect during halo implantation, and the metal gate is not exposed to un-reacted Ni wet strip. The present disclosure enjoys industrial applicability in any of various types of highly integrated high-k metal gate semiconductor technologies, particularly in 32 nm technology node advanced logic devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a first high-k metal gate stack on a substrate between source/drain regions, a second high-k metal gate stack on a shallow trench isolation (STI) region, and a first inter layer dielectric (ILD) between the first and second metal gate stacks;
    forming an etch stop layer on the first and second metal gate stacks;
    forming a second ILD on the etch stop layer, with openings over the first and second gate stacks;
    forming first and second spacers on the edges of the openings;
    forming a third ILD over the second ILD and the first and second spacers;
    removing the first ILD over the source/drain regions and the etch stop layer, the second ILD, and the third ILD over the source/drain regions, adjacent the first spacers, and over a portion of the first spacers, forming first trenches;
    removing the third ILD over the second high-k metal gate stack and over a portion of the second spacers, forming second trenches; and
    forming contacts in the first and second trenches.

2. The method according to claim 1, forming the first and second high-k metal gate stacks by:
    forming a first dummy gate, having first dummy spacers thereon, on the substrate, and forming a second dummy gate, having second dummy spacers thereon, on the STI region in the substrate;
    forming the first ILD over the first and second dummy gates;
    chemical mechanical polishing (CMP) the first ILD down to the top of the first and second dummy gates;
    removing the first and second dummy gates, forming first and second cavities;
    depositing a high-k dielectric layer and a metal work function layer in the first and second cavities, and filling the remainder of the first and second cavities with metal.

3. The method according to claim 2, comprising CMP until the first and second dummy spacers are planar with the top surface of the first and second dummy gates.

4. The method according to claim 3, comprising forming the etch stop layer of aluminum oxide ($Al_2O_3$) or hafnium oxide ($HfO_2$).

5. The method according to claim 4, comprising forming the openings in the second ILD using a reverse gate mask.

6. The method according to claim 5, comprising forming the first and second spacers by depositing a nitride material in the openings and etching the nitride.

7. The method according to claim 6, further comprising CMP subsequent to forming the third ILD.

8. The method according to claim 7, comprising forming a silicide on the source/drain regions prior to forming the first ILD.

9. The method according to claim 7, further comprising:
    forming a silicide on the source/drain regions subsequent to forming the first and second trenches; and
    subsequently forming contacts in the trenches.

* * * * *